(12) United States Patent
Naito et al.

(10) Patent No.: US 6,889,432 B2
(45) Date of Patent: May 10, 2005

(54) METHOD OF MANUFACTURING DOUBLE-SIDED CIRCUIT BOARD

(75) Inventors: Toshiki Naito, Ibaraki (JP); Yoshifumi Shinogi, Ibaraki (JP); Daisuke Uenda, Ibaraki (JP)

(73) Assignee: Nitto Denko Corporation, Osaka (JP)

( * ) Notice: Subject to any disclaimer, the term of this patent is extended or adjusted under 35 U.S.C. 154(b) by 131 days.

(21) Appl. No.: 10/358,219

(22) Filed: Feb. 5, 2003

(65) Prior Publication Data

US 2003/0221314 A1 Dec. 4, 2003

(30) Foreign Application Priority Data

Feb. 6, 2002 (JP) ..................................... P2002-029643

(51) Int. Cl.$^7$ ................................................. H01K 3/10
(52) U.S. Cl. ............................. 29/847; 29/825; 29/846; 29/847; 427/97.1; 427/97.2; 428/209; 430/313; 430/314
(58) Field of Search ......................... 29/825, 846, 847, 29/852; 427/97.1, 97.2; 428/209; 430/313, 314

(56) References Cited

U.S. PATENT DOCUMENTS

| | | | |
|---|---|---|---|
| 4,770,900 A | * | 9/1988 | Seibel ........................ 430/314 |
| 4,804,615 A | * | 2/1989 | Larson et al. ............... 430/314 |
| 4,812,213 A | | 3/1989 | Barton et al. |
| 5,153,987 A | * | 10/1992 | Takahashi et al. ............ 29/852 |
| 5,826,330 A | * | 10/1998 | Isoda et al. .................. 29/852 |
| 6,035,527 A | * | 3/2000 | Tamm ......................... 29/852 |
| 6,093,443 A | | 7/2000 | Schulz-Harder et al. |
| 6,242,079 B1 | * | 6/2001 | Mikado et al. ............. 428/209 |
| 6,376,049 B1 | * | 4/2002 | Asai et al. .................. 428/209 |
| 6,486,394 B1 | * | 11/2002 | Schmidt et al. ............... 174/36 |
| 6,591,495 B2 | * | 7/2003 | Hirose et al. ................. 29/846 |

FOREIGN PATENT DOCUMENTS

JP 2000-59026 A 2/2000

OTHER PUBLICATIONS

Japanese Abstract No. 05291727, dated Nov. 5, 1993.
Japanese Abstract No. 2000151079, dated May 30, 2000.
"Process for Manufacturing Multilayer Tab", Research Disclosure, Kenneth Mason Publications, Hampshire, GB, No. 373, May 1, 1995, pp. 303–307, XP000518622.

* cited by examiner

*Primary Examiner*—Carl J. Arbes
(74) *Attorney, Agent, or Firm*—Sughrue Mion, PLLC

(57) ABSTRACT

A method for manufacturing a double-sided circuit board from a board material having a first electric conductor layer and a first electrically insulating layer, including the steps of: making conduction holes in the board material so as to penetrate only the first electrically insulating layer or both the first electrically insulating layer and the first electric conductor layer; forming an electrically conductive thin-film layer on a surface of the first electrically insulating layer and wall surfaces of the conduction holes; forming a second electrically insulating layer on the electrically conductive thin-film layer; forming a first electric conductor wiring by electroplating on predetermined portions of the electrically conductive thin-film layer; covering the first electric conductor wiring with a chemical-resistant film; forming a second electric conductor wiring by chemically dissolving a predetermined portion of another surface of the first electric conductor layer; and removing the second electrically insulating layer and the film.

5 Claims, 6 Drawing Sheets

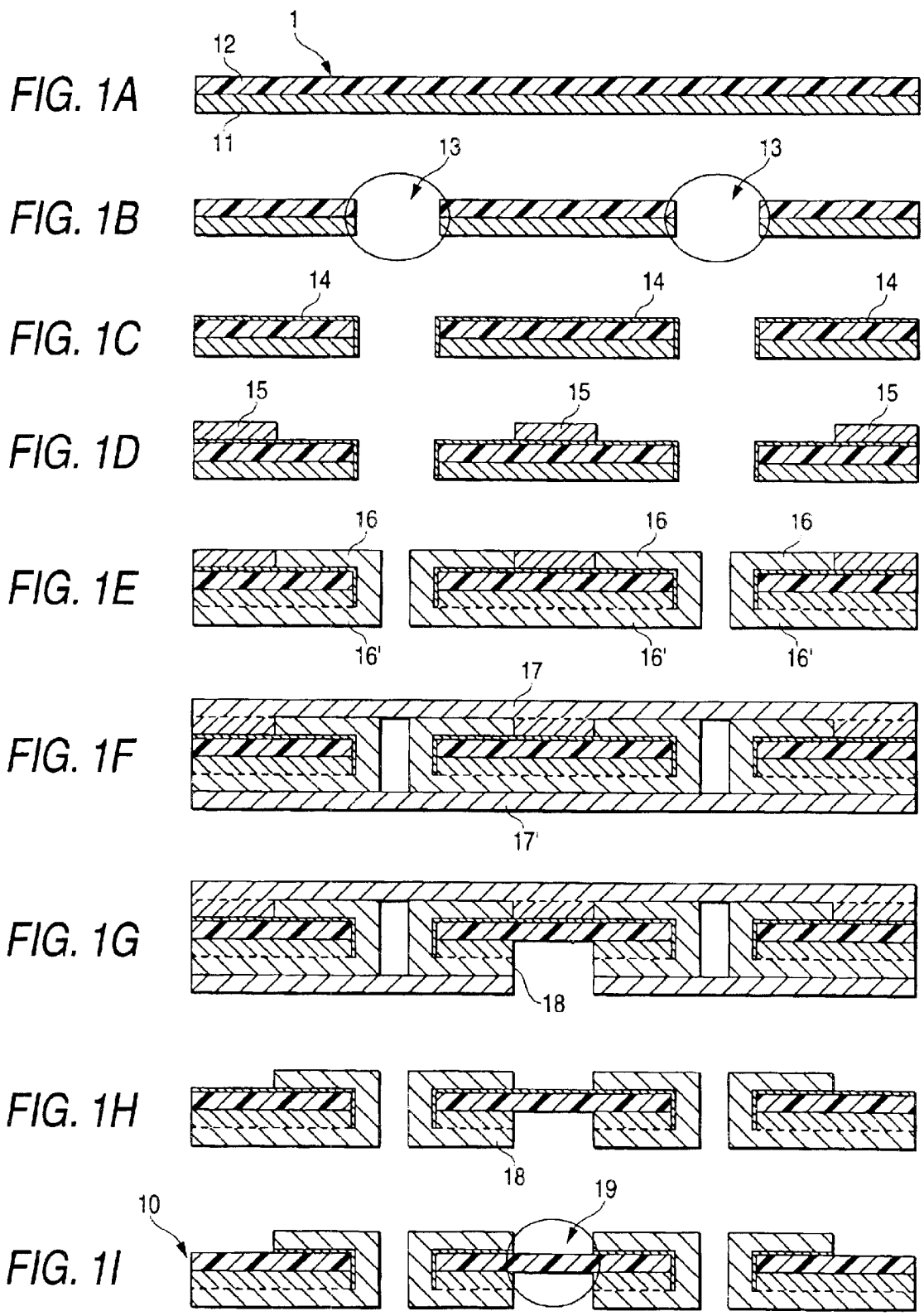

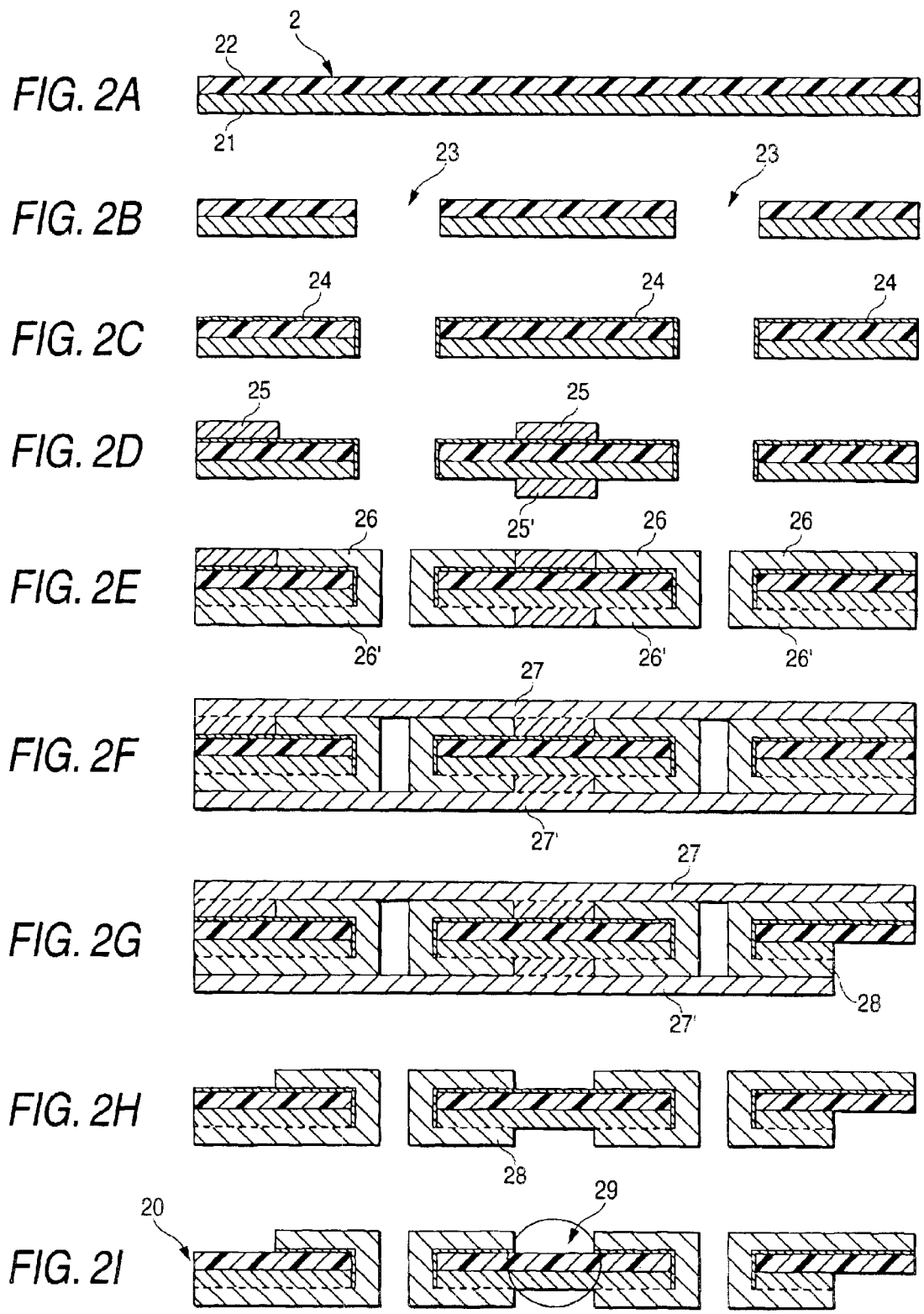

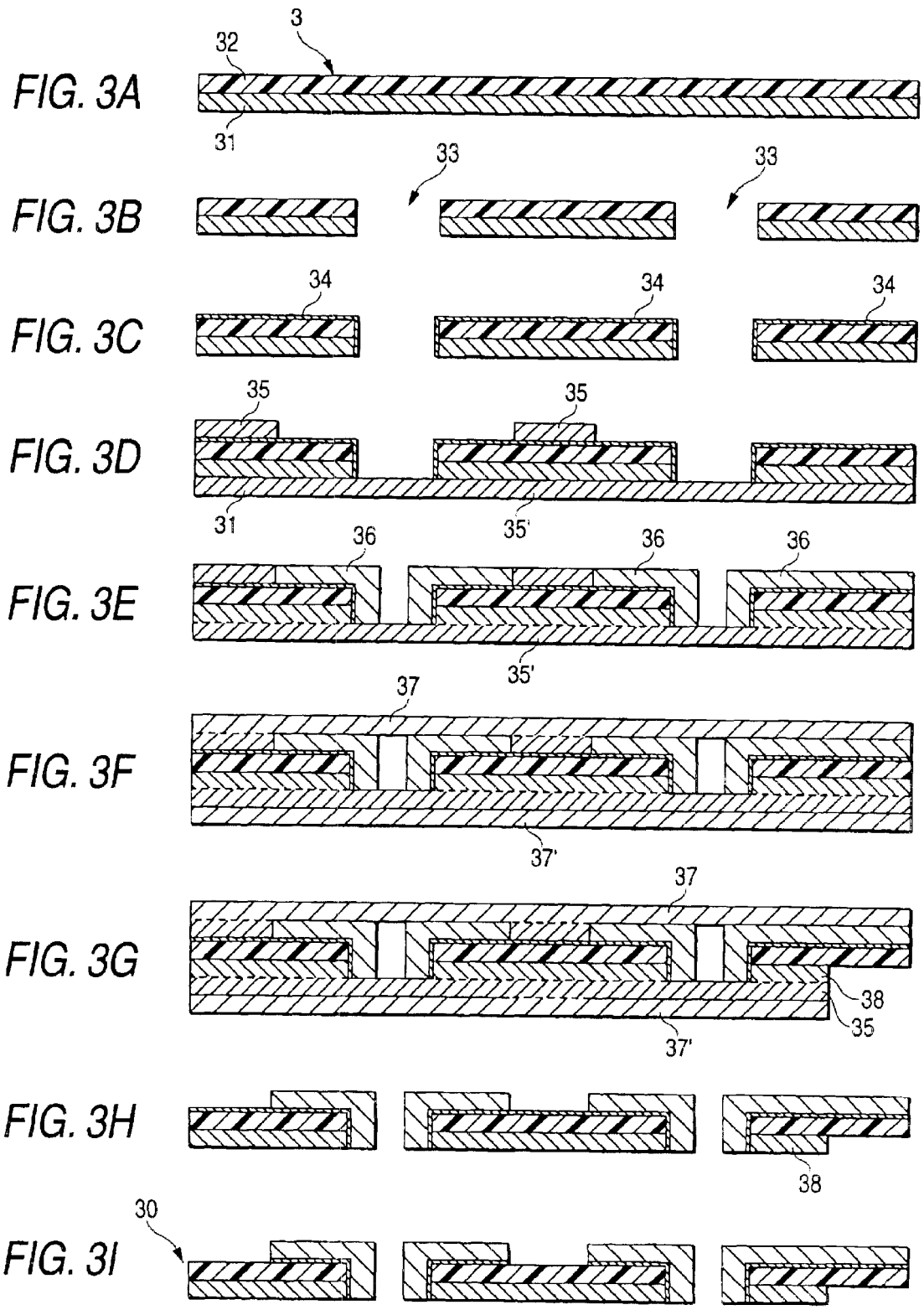

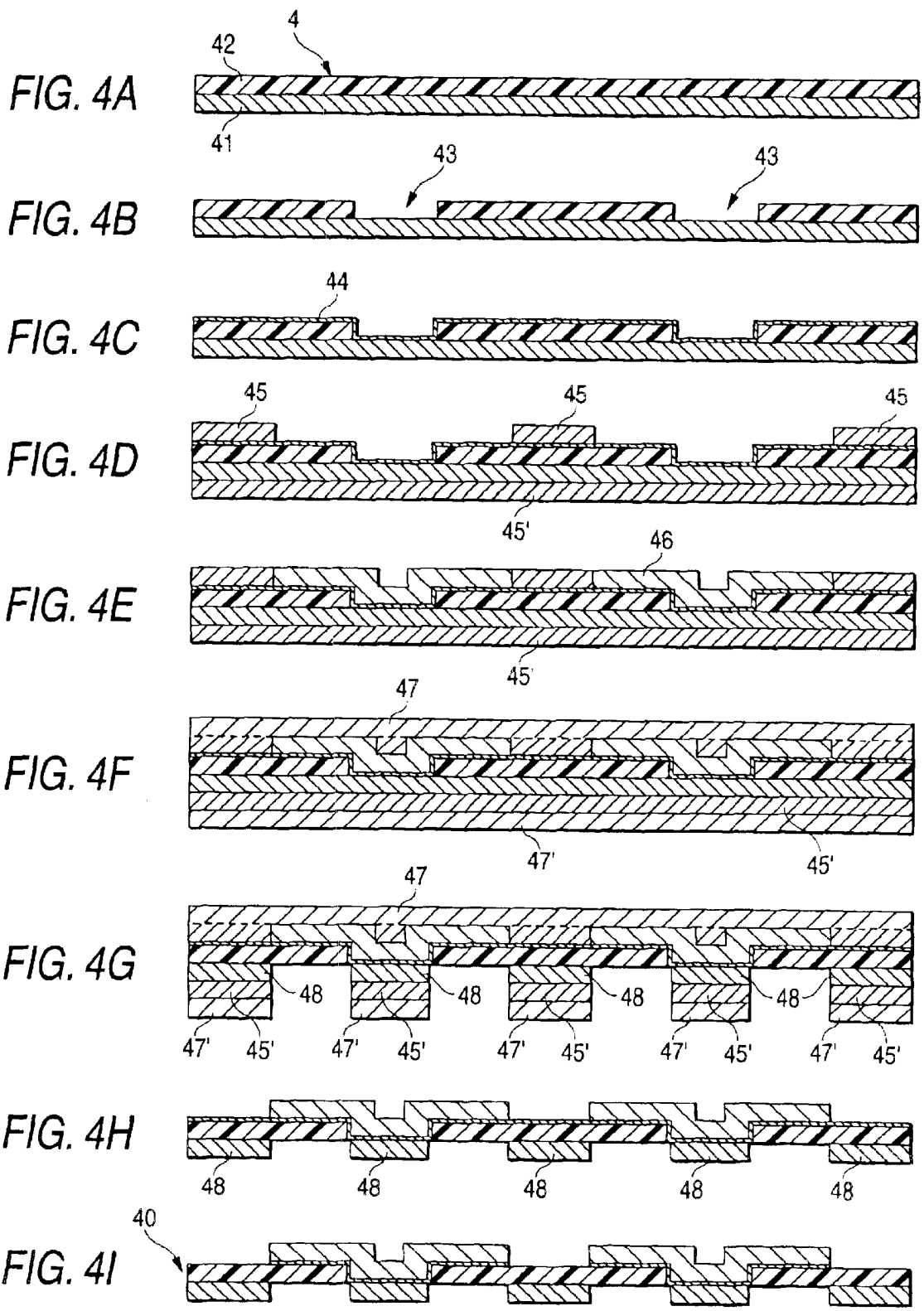

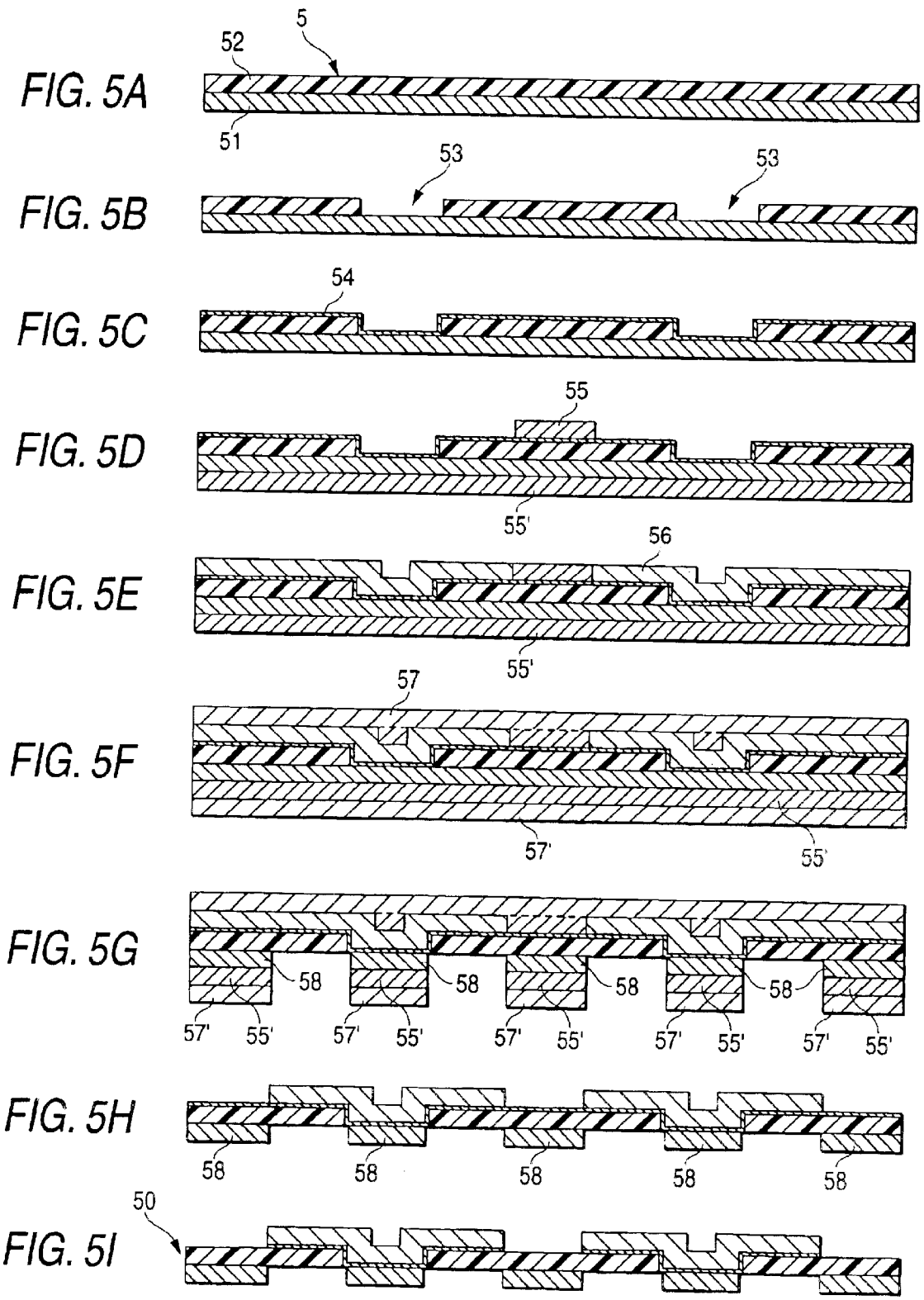

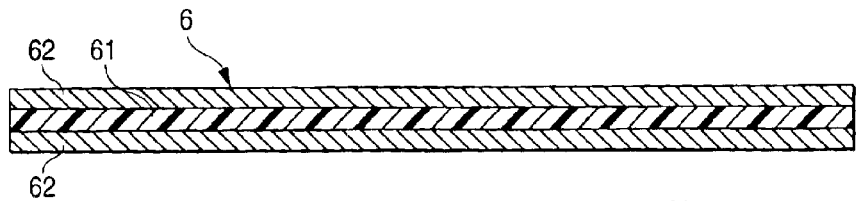
FIG. 6A
FIG. 6B
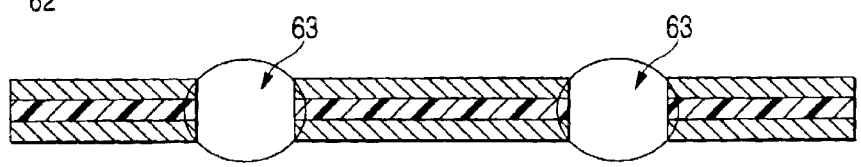
FIG. 6C
FIG. 6D
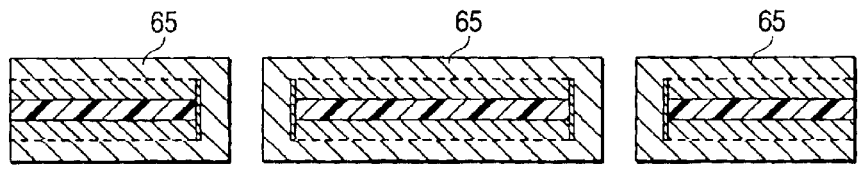
FIG. 6E
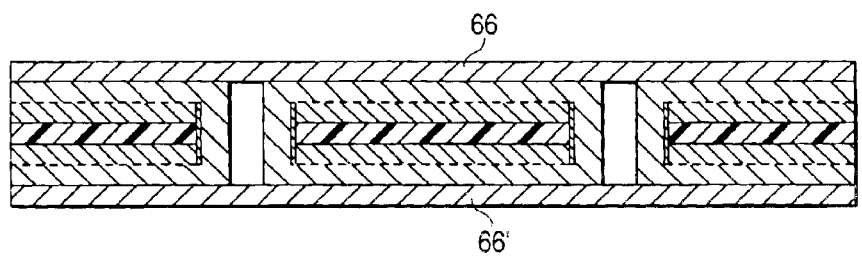
FIG. 6F
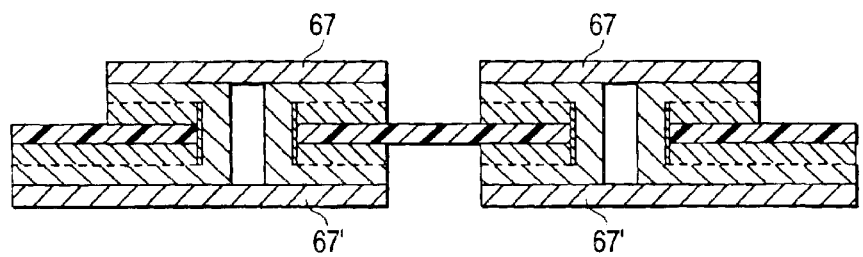
FIG. 6G
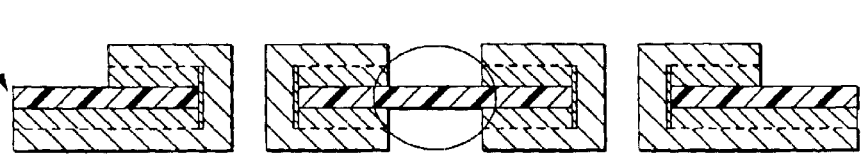

METHOD OF MANUFACTURING DOUBLE-SIDED CIRCUIT BOARD

The present application is based on Japanese Patent Application No. 2002-29643, the entire contents of which are incorporated herein by reference.

BACKGROUND OF THE INVENTION

1. Field of the Invention

The present invention relates to a method for manufacturing a double-sided circuit board having electric conductor wiring formed on opposite surfaces of an electrically insulating layer, and particularly to a manufacturing method suitable for manufacturing a flexible circuit board.

2. Related Art

A double-sided circuit board according to the related art is generally manufactured by a method shown in FIGS. 6A to 6G. That is, as shown in FIG. 6A, there is used a printed board material 6 which has an electrically insulating layer 61 such as a layer of polyimide, and electric conductor layers 62 such as layers of copper foil formed on opposite surfaces of the electrically insulating layer 61. As shown in FIG. 6B, conduction holes 63 are formed in the material 6 by drilling using a laser, a mold, or the like, by chemical dissolution or by a method using both drilling and chemical dissolution in combination. Then, as shown in FIG. 6C, an electrically conductive thin-film layer 64 is formed on wall surfaces of the conduction holes 63 by a method such as chemical treatment, vapor deposition or sputtering. Then, as shown in FIG. 6D, an electric conductor layer 65 such as a layer of copper is formed by electroplating on all the front and rear surfaces of the board material 6 inclusive of all the surface of the thin-film layer 64. Then, as shown in FIG. 6E, the electric conductor layer 65 is covered with photosensitive films 66. Then, as shown in FIG. 6F, after portions of the photosensitive films 66 corresponding to predetermined electric conductor wiring patterns are exposed and developed to thereby form chemical-resistant films 67, portions of the electric conductor layers 65 and 62 which are not covered with the chemical-resistant films 67 are chemically dissolved in chemicals. Finally, as shown in FIG. 6G, the chemical-resistant films 67 are removed. Thus, a double-sided circuit board 60 is manufactured.

That is, a so-called subtractive method in which portions unnecessary for electric conductor wiring patterns are removed from the electric conductor layers 62 formed on opposite surfaces of the electrically insulating layer 61 is used in the method for manufacturing a double-sided circuit board 60 according to the related art.

The requirements of higher-density and finer wiring in the double-sided circuit board have been elevated in recent years. Wiring formation by the subtractive method used heretofore, however, has a tendency to hardly meet the requirements. More specifically, in the case of the subtractive method, as described above, while the chemical-resistant films 67 obtained by exposing and developing portions corresponding to predetermined electric conductor wiring patterns are used as masks, the electric conductor layers 65 and 62 are dissolved in chemicals to thereby form electric conductor wiring. When fine wiring or high-density wiring is formed by this method, the dissolution chemicals spread so slowly that the velocity of dissolution varies largely in accordance with the wiring width or the gap width. Hence, there is a problem that uniform wiring can be hardly formed. In addition, there is another problem that the difference between the wiring width in surfaces of the electric conductor layers 65 and 62 and the wiring width in bottoms thereof is apt to become large.

On the other hand, an additive method in which an electric conductor wiring is formed on an electrically insulating board by electroplating is known as another method than the subtractive method. Particularly in the case of a flexible circuit board, stress generated inevitably in the electrically insulating board material due to carrying tension in a continuous carrying (sheeting) process is too large to be neglected because the electrically insulating board material is shaped like a flexible film. As a result, there is a problem that dimensional stability is lowered or the flexible circuit board is apt to be curled. In addition, when an electric conductor wiring is formed by electroplating, flexing characteristic such as bending characteristic of the flexible circuit board deteriorates because the electric conductor wiring is made of an electrolytically deposited metal. As a result, there is a further problem that the additive method is not suitable for the method of manufacturing a double-sided circuit board requiring sufficient flexing characteristic.

SUMMARY OF THE INVENTION

The invention is developed for solving the problems inherent in the related art, and an object of the invention is to provide a method for manufacturing a double-sided circuit board, which can meet the requirement of high-density fine wiring and by which a double-sided circuit board having high dimensional stability, hardly curled and adapted for a flex purpose can be obtained when the method is used for manufacturing a flexible circuit board.

In order to solve the problems, the invention provides a method of manufacturing a double-sided circuit board from a board material constituted by a first electric conductor layer and a first electrically insulating layer formed on one surface of the first electric conductor layer, including: the first step of making conduction holes in the board material so that the conduction holes penetrate only the first electrically insulating layer or both the first electrically insulating layer and the first electric conductor layer from predetermined portions of the first electrically insulating layer; the second step of forming an electrically conductive thin-film layer both on a surface of the first electrically insulating layer and on wall surfaces of the conduction holes; the third step of forming a second electrically insulating layer on at least one predetermined portion of the electrically conductive thin-film layer; the fourth step of forming a first electric conductor wiring by plating on a portion of the electrically conductive thin-film layer where the second electrically insulating layer is not formed; the fifth step of covering the first electric conductor wiring with a chemical-resistant film; the sixth step of forming a second electric conductor wiring by chemically dissolving at least one predetermined portion of the other surface of the first electric conductor layer in chemicals; and the seventh step of removing the second electrically insulating layer and the chemical-resistant film.

According to the invention, the first electric conductor wiring can meet the requirement of high-density fine wiring because the first electric conductor wiring is formed by plating. That is, the first electric conductor wiring can be formed uniformly without being influenced by the wiring width or the gap width, and the difference between the wiring width in the surface and the wiring width in the bottom can be reduced extremely. Incidentally, the second electric conductor wiring per se can hardly meet the requirement of high-density fine wiring because the second electric conductor wiring is formed by the so-called subtractive method, that is, by chemically dissolving the predetermined portion of the other surface of the first electric conductor layer in chemicals to remove the predetermined portion. The double-sided circuit board manufactured, however, can meet the requirement of high-density fine wiring as a whole because wiring can be drawn from the second electric conductor wiring to the first electric conductor wiring through the conduction holes.

Further, even in the case where the manufacturing method according to the invention is used for manufacturing a flexible circuit board, influence of carrying tension in a continuous carrying (sheeting) process can be reduced greatly because the first electric conductor layer has been already formed on the first electrically insulating layer (flexible film-like electrically insulating layer in this case) in the fourth step of forming the first electric conductor wiring by plating. As a result, a double-sided circuit board having high dimensional stability and hardly curled can be obtained. That is, because the electrical conductor layer is generally more elastic than the electrically insulating layer, stress generated in the board material is dispersed or relaxed by the presence of the first electric conductor layer so that the influence of carrying tension can be reduced greatly.

Moreover, the second electrically insulating layer is formed on portions requiring flexing characteristic such as bending characteristic so that the first electric conductor wiring can be prevented from being formed on the portions by plating (in addition, portions of the other surface of the first electric conductor layer where the first electric conductor wiring is not formed are chemically dissolved as occasion demands). Thus, sufficient flexing characteristic can be obtained.

BRIEF DESCRIPTION OF THE DRAWINGS

FIGS. 1A to 1I are views for explaining a method of manufacturing a double sided circuit board according to a first embodiment of the invention;

FIGS. 2A to 2I are views for explaining a method of manufacturing a double-sided circuit board according to a second embodiment of the invention;

FIGS. 3A to 3I are views for explaining a method of manufacturing a double-sided circuit board according to a third embodiment of the invention;

FIGS. 4A to 4I are views for explaining a method of manufacturing a double-sided circuit board according to a fourth embodiment of the invention;

FIGS. 5A to 5I are views for explaining a method of manufacturing a double-sided circuit board according to a fifth embodiment of the invention; and FIGS. 6A to 6G are views for explaining a method of manufacturing a double-sided circuit board according to the related art.

DETAILED DESCRIPTION OF THE PREFERRED EMBODIMENTS

Embodiments of the invention will be described below with reference to the accompanying drawings.

First Embodiment

FIGS. 1A to 1I are views for explaining a method of manufacturing a double-sided circuit board according to a first embodiment of the invention. As shown in FIG. 1A, a board material 1 having a first electric conductor layer 11, and a first electrically insulating layer 12 formed on one surface of the first electric-conductor layer 11 is used in the manufacturing method according to this embodiment. In this embodiment, a layer of a metal or metal foil capable of being treated with chemicals, such as copper foil, copper alloy, stainless steel, or nickel is preferably used as the first electric conductor layer 11. The thickness of the first electric conductor layer 11 is generally selected to be in a range of from 1 $\mu$m to 100 $\mu$m, preferably in a range of from 3 $\mu$m to 30 $\mu$m. On the other hand, a resin excellent in chemical resistance, heat resistance and high dimensional stability, such as a polyimide-based resin, is preferably used as the first electrically insulating layer 12. The thickness of the first electrically insulating layer 12 is generally selected to be in a range of from 3 $\mu$m to 200 $\mu$m, preferably in a range of from 5 $\mu$m to 100 $\mu$m.

Then, as shown in FIG. 1B, conduction holes 13 are formed in the board material 1 so that the conduction holes 13 penetrate both the first electrically insulating layer 12 and the first electric conductor layer 11 from predetermined portions of the first electrically insulating layer 12. Incidentally, as the method for forming the conduction holes 13, there may be used a known method such as drilling using a laser, a mold or the like, dissolution using chemicals, or use of a photosensitive resin. The diameter of each of the conduction holes 13 is generally selected to be in a range of from 10 $\mu$m to 500 $\mu$m, preferably in a range of from 30 $\mu$m to 30 $\mu$m.

Then, as shown in FIG. 1C, an electrically conductive thin-film layer 14 is formed both on the surface of the first electrically insulating layer 12 and on wall surfaces of the conduction holes 13. Incidentally, Ni, Cr, Cu, Ni/Cr alloy, Cu/Ni alloy, Ti or an alloy of these metals is preferably used as the material of the electrically conductive thin-film layer 14. Especially, Cr-based metal such as Cr or Ni/Cr alloy is preferably used as the material of the electrically conductive thin-film layer 14. The thickness of the electrically conductive thin-film layer 14 is generally selected to be in a range of from 3 Å to 3000 Å, preferably in range of from 5 Å to 2000 Å. In addition, the electrically conductive thin-film layer 14 is not limited to a single layer but may be provided as a laminate of a plurality of layers in accordance with necessity.

Then, as shown in FIG. 1D, a second electrically insulating layer 15 is formed on predetermined portions of the electrically conductive thin-film layer 14. Incidentally, a material having resistance to electrolytic plating solution is used as the material of the second electrically insulating layer 15. The thickness of the second electrically insulating layer 15 is preferably selected to be larger than the plating thickness of a first electric conductor wiring 16 which will be described later. When, for example, the plating thickness of the first electric conductor wiring 16 is 10 $\mu$m, the second electrically insulating layer 15 is formed as a 15 $\mu$m-thick layer. In addition, in order to process the second electrically insulating layer 15 into a shape corresponding to a pattern of the first electric conductor wiring 16 which will be described later, a photosensitive electrically insulating material may be used as an example of the material of the second electrically insulating layer 15 so that portions of the electrically insulating material corresponding to the pattern of the electric conductor wiring are exposed and developed and then non-developed portions of the electrically insulating material are dissolved.

Then, as shown in FIG. 1E, the first electric conductor wiring 16 is formed by electroplating on the portions of the electrically conductive thin-film layer 14 where the second electrically insulating layer 15 is not formed. In this embodiment, an electric conductor layer 16' is formed by electroplating on the other surface of the first electric conductor layer 11 where the electrically conductive thin film layer 14 is Not formed. Incidentally, for example, the electroplating is performed by immersing the board material 1 in an electrolytic plating solution of copper sulfate and applying electricity to the electrolytic plating solution.

Then, as shown in FIG. 1F, the first electric conductor wiring 16 is covered with a film 17, for example, having chemical resistance to acid such as ferric chloride or cupric chloride. For example, a photosensitive electrically insulating material is used as the material of the film 17. When the whole surface of the electrically insulating material is exposed and developed, the film 17 having such chemical resistance is formed. Incidentally, in this embodiment, a film 17' similar to the film 17 is formed on the electric conductor layer 16'. The film 17' is however different from the film 17 in that only portions of the film 17' corresponding to a pattern of a second electric conductor wiring 18 which will be described later are exposed and developed so as to have chemical resistance whereas the whole surface of the film 17 is exposed and developed. In addition, the film 17' is different from the second electrically insulating layer 15 in that the film 17' functions as a protective film when the second electric conductor wiring 18 which will be described later is formed by a subtractive method. Hence, from the point of view of reducing the difference between the wiring width in the surface and the wiring width in the bottom, it is preferable that the thickness of the film 17' is as small as possible (.e.g., 15 μm or smaller) For example, the film 17' is formed by use of a liquid resist.

Then, as shown in FIG. 1G, a second electric conductor wiring 18 is formed by chemically dissolving predetermined portions of the other surface of the first: electric conductor layer 11 (inclusive of predetermined portions of the film 17' and the electric conductor layer 16' in this embodiment) in chemicals. That is, the second electric conductor wiring 18 is formed by a subtractive method. Incidentally, acid (such as ferric chloride or cupric chloride) is used in dissolution of the electric conductor layer in this embodiment.

Then, as shown in FIG. 1H, the films 17 and 17' and the second electrically insulating layer 15 are removed. Incidentally, for example, the films 17 and 17' and the second electrically insulating layer 15 can be separated and removed by alkaline chemicals.

Finally, as shown in FIG. 1I, the electrically conductive thin-film layer 14 remaining on the first electrically insulating layer 12 is removed. Thus, a double-sided circuit board 10 having the first electric conductor wiring 16 and the second electric conductor wiring 18 is completed. Incidentally, for example, the electrically conductive thin-film layer 14 can be separated and removed by acidic chemicals.

Incidentally, the first and second electric conductor wirings 16 and 18 by electroplating are not formed on the predetermined portion 19 of the double-sided circuit board 10 manufactured by the method according to this embodiment but the predetermined portion 19 is constituted by only the first electrically insulating layer 12. Hence, when, for example, the first electrically insulating layer 12 is made of a flexible film-like material, sufficient flexing characteristic can be obtained in this portion 19.

Second Embodiment

FIGS. 2A to 2I are views for explaining a method of manufacturing a double-sided circuit board according to a second embodiment of the invention. As shown in FIG. 2A, a board material 2 having a first electric conductor layer 21, and a first electrically insulating layer 22 formed on one surface of the first electric conductor layer 21 is used in the manufacturing method according to this embodiment, like the first embodiment. The preferred materials for forming the first electric conductor layer 21 and the first electrically insulating layer 22 and the preferred thicknesses of the materials are the same as those in the first embodiment.

Then, as shown in FIG. 2B, conduction holes 23 are formed in the board material 2 so that the conduction holes 23 penetrate both the first electrically insulating layer 22 and the first electric conductor layer 21 from predetermined portions of the first electrically insulating layer 22. Incidentally, the preferred method for forming the conduction holes 23 and the preferred diameter of each of the conduction holes 23 are the same as those in the first embodiment.

Then, as shown in FIG. 2C, an electrically conductive thin-film layer 24 is formed both on the surface of the first electrically insulating layer 22 and on wall surfaces of the conduction holes 23. Incidentally, the preferred material of the electrically conductive thin-film layer 24 and the preferred thickness of the electrically conductive thin-film layer 24 are the same as those in the first embodiment.

Then, as shown in FIG. 2D, a second electrically insulating layer 25 is formed on predetermined portions of the electrically conductive thin-film layer 24. In this embodiment, an electrically insulating layer 25' is also formed on a predetermined portion of the other surface of the first electric conductor layer 21. Incidentally, the preferred materials of the second electrically insulating layer 25 and the electrically insulating layer 25' and the preferred thicknesses thereof are the same as those of the second electrically insulating layer 15 in the first embodiment.

Then, as shown in FIG. 2E, a first electric conductor wiring 26 is formed by electroplating on the portions of the electrically conductive thin-film layer 24 where the second electrically insulating layer 25 is not formed. In this embodiment, an electric conductor layer 26' is also formed by electroplating on portions where the electrically insulating layer 25' is not formed, among portions of the other surface of the first electric conductor layer 21 where the electrically conductive thin film layer 24 is not formed. Incidentally, for example, the electroplating is performed by immersing the board material 2 in an electrolytic plating solution of copper sulfate and applying electricity to the electrolytic plating solution in the same manner as in the first embodiment.

Then, as shown in FIG. 2F, the first electric conductor wiring 26 is covered with a film 27, for example, having chemical resistance to acid such as ferric chloride or cupric chloride. Incidentally, also in this embodiment, a film 27' similar to the film 27 is also formed on the electric conductor layer 26' in the same manner as in the first embodiment. The preferred materials of the films 27 and 27' and the preferred thicknesses of the films 27 and 27' are the same as those of the films 17 and 17' in the first embodiment.

Then, as shown in FIG. 2G, a second electric conductor wiring 28 is formed by chemically dissolving predetermined portions of the other surface of the first electric conductor layer 21 (inclusive of predetermined portions of the film 27' and the electric conductor layer 26' in this embodiment) in chemicals. Incidentally, the dissolution method is the same as in the first embodiment.

Then, as shown in FIG. 2H, the films 27 and 27', the second electrically insulating layer 25 and the electrically insulating layer 25' are removed. Incidentally, the method for removing these films and layers is the same as in the first embodiment.

Finally, as shown in FIG. 2I, the electrically conductive, thin-film layer 24 remaining on the first electrically insulating layer 22 is removed. Thus, a double-sided circuit board 20 having the first electric conductor wiring 26 and the second electric conductor wiring 28 is completed. Incidentally, the method for removing the electrically conductive thin-film film 24 is the same as in the first embodiment.

Incidentally, the first electric conductor wiring 26 by electroplating is not formed on a predetermined portion 29 of the double-sided circuit board 20 manufactured by the method according to this embodiment but the predetermined portion 29 is constituted by the first electrically insulating layer 22 and the first electric conductor layer 21. Hence, when, for example, the first electrically insulating layer 22 is made of a flexible film-like material and the first electric conductor layer 21 is made of a rolled sheet of copper foil or the like, sufficient flexing characteristic can be obtained in this portion 29.

Third Embodiment

FIGS. 3A to 3I are views for explaining a method of manufacturing a double-sided circuit board according to a third embodiment of the invention. As shown in FIG. 3A, a board material 3 having a first electric conductor layer 31, and a first electrically insulating layer 32 formed on one surface of the first electric conductor layer 31 is used in the manufacturing method according to this embodiment, like the first embodiment. The preferred materials for forming the first electric conductor layer 31 and the first electrically insulating layer 32 and the preferred thicknesses of the first electric conductor layer 31 and the first electrically insulating layer 32 are the same as those in the first embodiment.

Then, as shown in FIG. 3B, conduction holes 33 are formed in the board material 3 so that the conduction holes 33 penetrate both the first electrically insulating layer 32 and the first electric conductor layer 31 from predetermined portions of the first electrically insulating layer 32. Incidentally, the preferred method for forming the conduction holes 33 and the preferred diameter of each of the conduction holes 33 are the same as those in the first embodiment.

Then, as shown in FIG. 3C, an electrically conductive thin-film layer 34 is formed both on the surface of the first electrically insulating layer 32 and on wall surfaces of the conduction holes 33. Incidentally, the preferred material of the electrically conductive thin-film layer 34 and the preferred-thickness thereof are the same as those in the first embodiment.

Then, as shown in FIG. 3D, a second electrically insulating layer 35 is formed on predetermined portions of the electrically conductive thin-film layer 34. Incidentally, in this embodiment, an electrically insulating layer 35' is also formed on the whole of the other surface of the first electric conductor layer 31. Incidentally, the preferred materials of the second electrically insulating layer 35 and the electrically insulating layer 35' and the preferred thicknesses thereof are the same as those of the second electrically insulating layer 15 in the first embodiment.

Then, as shown in FIG. 3E, a first electric conductor wiring 36 is formed by electroplating on the portions of the electrically conductive thin-film layer 34 where the second electrically insulating layer 35 is not formed. In this embodiment, an electric conductor layer is not formed by electroplating on the other surface of the first electric conductor layer 31 because the electrically insulating layer 35' is formed on the whole of the other surface of the first electric conductor layer 31. Incidentally, for example, the electroplating is performed by immersing the board material 3 in an electrolytic plating solution of copper sulfate in the same manner as in the first embodiment.

Then, as shown in FIG. 3F, the first electric conductor wiring 36 is covered with a film 37, for example, having chemical resistance to acid such as ferric chloride or cupric chloride. Incidentally, also in the embodiment, a film 37' similar to the film 37 is formed on the electrically insulating layer 35 in the same manner as in the first embodiment. The preferred materials of the films 37 and 37' and the preferred thicknesses thereof are the same as those of the films 17 and 17' in the first embodiment.

Then, as shown in FIG. 3G, a second electric conductor wiring 38 is formed by chemically dissolving a predetermined portion of the other surface of the first electric conductor layer 31 (inclusive of predetermined portions of the film 37' and the electrically insulating layer 35' in this embodiment) in chemicals. Incidentally, the dissolution method is the same as in the first embodiment.

Then, as shown in FIG. 3H, the films 37 and 37', the second electrically insulating layer 35 and the electrically insulating layer 35' are removed. Incidentally, the method for removing these films and layers is the same as in the first embodiment.

Finally, as shown in FIG. 3I, the electrically conductive thin-film layer 34 remaining on the first electrically insulating layer 32 is removed. Thus, a double-sided circuit board 30 having the first electric conductor wiring 36 and the second electric conductor wiring 38 is completed. Incidentally, the method for removing the electrically conductive thin-film layer 34 is the same as in the first embodiment.

Fourth Embodiment

FIGS. 4A to 4I are views for explaining a method of manufacturing a double-sided circuit board according to a fourth embodiment of the invention. As shown in FIG. 4A, a board material 4 having a first electric conductor layer 41, and a first electrically insulating layer 42 formed on one surface of the first electric conductor layer 41 is used in the manufacturing method according to this embodiment, like the first embodiment. The preferred materials for forming the first electric conductor layer 41 and the first electrically insulating layer 42 and the preferred thicknesses thereof are the same as those in the first embodiment.

Then, as shown in FIG. 4B, conduction holes 43 are formed in the board material 4 so that the conduction holes penetrate only the first electrically insulating layer 42 from predetermined portions of the first electrically insulating layer 42. Incidentally, the preferred method for forming the conduction holes 43 and the preferred diameter of each of the conduction holes 43 are the same as those in the first embodiment.

Then, as shown in FIG. 4C, in this embodiment, an electrically conductive thin-film layer 44 is formed on bottoms of the conduction holes 43, that is, on exposed surfaces of the first electric conductor layer 41 as well as the electrically conductive thin-film layer 44 is formed both on the surface of the first electrically insulating layer 42 and on wall surfaces of the conduction holes 43. Incidentally, the preferred material of the electrically conductive thin-film layer 44 and the preferred thickness thereof are the same as those in the first embodiment.

Then, as shown in FIG. 4D, a second electrically insulating layer 45 is formed on predetermined portions of the electrically conductive thin-film layer 44. Incidentally, in this embodiment, an electrically insulating layer 45' is also formed on the whole of the other surface of the first electric conductor layer 41. Incidentally, the preferred materials of the second electrically insulating layer 45 and the electrically insulating layer 45' and the preferred thicknesses thereof are the same as those of the second electrically insulating layer 15 in the first embodiment.

Then, as shown in FIG. 4E, a first electric conductor wiring 46 is formed by electroplating on the portions of the electrically conductive thin-film layer 44 where the second electrically insulating layer 45 is not formed. In this embodiment, the electric conductor layer by electroplating is not formed on the other surface of the first electric conductor layer 41 because the electrically insulating layer 45' is formed on the whole of the other surface of the first electric conductor layer 41. Incidentally, for example, the electroplating is performed by immersing the board material 4 in an electrolytic plating solution of copper sulfate in the same manner as in the first embodiment.

Then, as shown in FIG. 4F, the first electric conductor, wiring 46 is covered with a film 47, for example, having chemical resistance to acid such as ferric chloride or cupric chloride. Incidentally, also in this embodiment, a film 47' similar to the film 47 is formed on the electrically insulating layer 45' in the same manner as in the first embodiment. The preferred materials of the films 47 and 47' and the preferred thicknesses thereof are the same as those of the films 17 and 17' in the first embodiment.

Then, as shown in FIG. 4G, a second electric conductor wiring 48 is formed by chemically dissolving predetermined portions of the other surface of the first electric conductor layer 41 (inclusive of predetermined portions of the film 47' and the electrically insulating layer 45' in this embodiment) in chemicals. Incidentally, the dissolution method is the same as in the first embodiment.

Then, as shown in FIG. 4H, the films 47 and 47', the second electrically insulating layer 45 and the electrically insulating layer 45' are removed. Incidentally, the method for removing these films and layers is the same as in the first embodiment.

Finally, as shown in FIG. 4I, the electrically conductive thin-film layer 44 remaining on the first electrically insulating layer 42 is removed. Thus, a double-sided circuit board 40 having the first electric conductor wiring 46 and the second electric conductor wiring 48 is completed. Incidentally, the method for removing the electrically conductive thin-film layer 44 is the same as in the first embodiment.

Fifth Embodiment

FIGS. 5A to 5I are views for explaining a method of manufacturing a double-sided circuit board according to a fifth embodiment of the invention. As shown in FIG. 5A, a board material 5 having a first electric conductor layer 51, and a first electrically insulating layer 52 formed on one surface of the first electric conductor layer 51 is used in the manufacturing method according to this embodiment, like the first embodiment. The preferred materials for forming the first electric conductor layer 51 and the first electrically insulating layer 52 and the preferred thicknesses thereof are the same as those in the first embodiment.

Then, as shown in FIG. 5B, conduction holes 53 are formed in the board material 5 so that the conduction holes 53 penetrate only the first electrically insulating layer 52 from predetermined portions of the first electrically insulating layer 52. Incidentally, the preferred method for forming the conduction holes 53 and the preferred diameter of each of the conduction holes 53 are the same as those in the first embodiment.

Then, as shown in FIG. 5C, an electrically conductive thin-film layer 54 is formed on the surface of the first electrically insulating layer 52, wall surfaces of the conduction holes 53, and bottoms of the conduction holes 53. Incidentally, the preferred material of the electrically conductive thin-film layer 54 and the preferred thickness thereof are the same as those in the first embodiment.

Then, as shown in FIG. 5D, a second electrically insulating layer 55 is formed on a predetermined portion of the electrically conductive thin-film layer 54. Incidentally, in this embodiment, an electrically insulating layer 55' is also formed on the whole of the other surface of the first electric conductor layer 51. Incidentally, the preferred materials of the second electrically insulating layer 55 and the electrically insulating layer 55' and the preferred thicknesses thereof are the same as those of the second electrically insulating layer 15 in the first embodiment.

Then, as shown in FIG. 5E, a first electric conductor wiring 56 is formed by electroplating on the portion of the electrically conductive thin-film layer 54 where the second electrically insulating layer 55 is not formed. In this embodiment, an electric conductor layer by electroplating is not formed on the other surface of the first electric conductor layer 51 because the electrically insulating layer 55' is formed on the whole of the other surface of the first electric conductor layer 51. Incidentally, the electroplating is performed by immersing the board material 5 in an electrolytic plating solution of copper sulfate and applying electricity to the electrolytic plating solution in the same manner as in the first embodiment.

Then, as shown in FIG. 5F, the first electric conductor wiring 56 is covered with a film 57, for example, having chemical resistance to acid such as ferric chloride or cupric chloride. Incidentally, also in this embodiment, a film 57' similar to the film 57 is formed on the electrically insulating layer 55' in the same manner as in the first embodiment. The preferred materials of the films 57 and 57' and the preferred thicknesses thereof are the same as those of the films 17 and 17' in the first embodiment.

Then, as shown in FIG. 5G, a second electric conductor wiring 58 is formed by chemically dissolving predetermined portions of the other surface of the first electric conductor layer 51 (inclusive of predetermined portions of the film 57' and the electrically insulating layer 55' in this embodiment) in chemicals. Incidentally, the dissolution method is the same as in the first embodiment. In this embodiment, a predetermine portion of the first electric conductor wiring 56 is also dissolved so that a predetermined pattern of the first electric conductor wiring 56 is formed.

Then, as shown in FIG. 5H, the films 57 and 57', the second electrically insulating layer 55 and the electrically insulating layer 55'are removed. Incidentally, the method for removing these films and layers is the same as in the first embodiment.

Finally, as shown in FIG. 5I, the electrically conductive thin-film layer 54 remaining on the first electrically insulating layer 52 is removed. Thus, a double-sided, circuit board 50 having the first electric conductor wiring 56 and the second electric conductor wiring 58 is completed. Incidentally, the method for removing the electrically conductive thin-film layer 54 is the same as in the first embodiment.

Incidentally, in the double-sided circuit board manufactured by the manufacturing method according to each of the first to fifth embodiments described above, an electrically insulating layer (cover layer) may be formed on the first electric conductor wiring and the second electric conductor wiring in accordance with necessity, and surface treatment such as gold plating may be further applied to the electrically insulating layer in accordance with necessity.

EXAMPLES

Description will be made on the following examples so that the characteristic of the invention will be made clearer.

Example 1

In this example, a double-sided circuit board was manufactured by the manufacturing method according to the first embodiment shown in FIGS. 1A to 1I. First, as a board material 1, there was used a copper-clad laminate (e.g., ESPANEX made by Nippon Steel Chemical Co., Ltd. or NEOFLEX made by Mitsui Chemicals Inc.) in which a first electrically insulating layer 12 made of a polyimide resin with a thickness of 25 $\mu$m was formed directly on one surface of a first electric conductor layer 11 made of copper foil with a thickness of 12 $\mu$m. Then, conduction holes 13 each having a diameter of 75 $\mu$m were formed by a YAG laser. Then, an electrically conductive thin-film layer 14 made of an Ni/Cr alloy with a thickness of 500 Å was formed by sputtering. Then, as a second electrically insulating layer 15, a photosensitive electrically insulating film (e.g., SPG152 made by Asahi Kasei Corp.) having a thickness of 15 $\mu$m was laminated on the resulting laminate. After the second electrically insulating layer 15 was irradiated with ultraviolet light while predetermined positions were covered with glass masks capable of shielding the light, the second electrically insulating layer 15 was developed in an alkaline solution. Then, the board material 1 was immersed in an electrolytic plating solution of copper sulfate and plated at the rate of 2.5 A/dm$^2$ for about 18 minutes to thereby form a first electric conductor wiring 16 made of a copper plating with a thickness of 8 $\mu$m. Further, an electric conductor layer 16' made of a copper plating with a thickness of 8 $\mu$m was formed on the whole of the other surface of the first electric conductor; layer 11. Thus, a copper layer having a total thickness of 20 $\mu$m was formed as a combination of the first electric conductor layer 11 and the electric conductor layer 16'. Then, as each of films 17 and 17', a photosensitive electrically insulating film (e.g., SFG102 made by Asahi Kasei Corp.) having a thickness of 10 $\mu$m was laminated on the resulting laminate. After the film 17' was exposed and developed in accordance with a desired wiring pattern, the 20 $\mu$m-thick copper layer was dissolved in ferric chloride to thereby form a second electric conductor wiring 18. Further, the films 17 and 17', the second electrically insulating layer 15 and the electrically conductive thin-film layer 14 were removed. Thus, a double-sided circuit board 10 was obtained. It was confirmed that the first electric conductor wiring 16 was formed uniformly and the difference between the wiring width in the surface and the wiring width in the bottom was reduced extremely in the double-sided circuit board 10 manufactured according to this example. In addition, the double-sided circuit board 10 was produced as a board having high dimensional stability, hardly curled and having sufficient flexing characteristic.

Example 2

In this example, a double-sided circuit board was manufactured by the manufacturing method according to the second embodiment shown in FIGS. 2A to 2I. First, as a board material 2 there was used a copper-clad laminate (e.g., ESPANEX made by Nippon Steel Chemical Co., Ltd. or NEOFLEX made by Mitsui Chemicals Inc.) in which a first electrically insulating layer 22 made of a polyimide resin with a thickness of 12 $\mu$m was formed directly on one surface of a first electric conductor layer 21 made of copper foil with a thickness of 12 $\mu$m. Then, conduction holes 23 each having a diameter of 100 $\mu$m were formed by a YAG laser. Then, an electrically conductive thin-film layer 24 made of an Ni/Cu alloy with a thickness of 300 Å was formed by sputtering. Then, as each of a second electrically insulating layer 25 and an electrically insulating layer 25', a photosensitive electrically insulating film (e.g., SPG152 made by Asahi Kasei Corp.) having a thickness of 15 $\mu$m was laminated on the resulting laminate. After the second electrically insulating layer 25 and the electrically insulating layer 25' were irradiated with ultraviolet light while predetermined positions were covered with glass masks capable of shielding the light, the second electrically insulating layer 25 and the electrically insulating layer 25' were developed in an alkaline solution. Then, the board material 2 was immersed in an electrolytic plating solution of copper sulfate and plated at the rate of 2.5 A/dm$^2$ for about 20 minutes to thereby form a first electric conductor wiring 26 made of a copper plating with a thickness of 10 $\mu$m. Further, an electric conductor layer 26' made of a copper plating with a thickness of 10 $\mu$m was formed on portions which were on the other surface of the first electric conductor layer 21 and on which the electrically insulating layer 25' was not formed. Thus, a copper layer having a total thickness of 22 $\mu$m was formed as a combination of the first electric conductor layer 21 and the electric conductor layer 26'. Then, as each of films 27 and 27', a photosensitive electrically insulating film (e.g., RY3206 made by Hitachi Chemical Co., Ltd.) having a thickness of 6 $\mu$m was laminated on the resulting laminate. After the film 27' was exposed and developed in accordance with a desired wiring pattern, the 22 $\mu$m-thick copper layer was dissolved in ferric chloride to thereby form a second electric conductor wiring 28. Further, the films 27 and 27', the second electrically insulating layer 25, the electrically insulating layer 25' and the electrically conductive thin-film layer 24 were removed. Thus, a double-sided circuit board 20 was obtained. It was confirmed that the first electric conductor wiring 26 was formed uniformly and the difference between the wiring width in the surface and the wiring width in the bottom was reduced extremely in the double-sided circuit board 20 manufactured according to this example. In addition, the double-sided circuit board 20 was produced as a board having high dimensional stability, hardly curled and having sufficient flexing characteristic.

Example 3

In this example, a double-sided circuit board was manufactured by the manufacturing method according to the third embodiment shown in FIGS. 3A to 3I. First, as a board material 3, there was used a copper-clad laminate (e.g., ESPANEX made by Nippon Steel Chemical Co., Ltd. or NEOFLEX made by Mitsui Chemicals Inc.) in which a first electrically insulating layer 32 made of a polyimide resin with a thickness of 12 $\mu$m was formed directly on one surface of a first electric conductor layer 31 made of copper foil with a thickness of 18 $\mu$m. Then, conduction holes 33 each having a diameter of 150 μm were formed by punching. Then, an electrically conductive thin-film layer 34 made of Cr with a thickness of 400 Å was formed by sputtering. Then, as each of a second electrically insulating layer 35 and an electrically insulating layer 35', a photosensitive electrically insulating film (e.g., SPG252 made by Asahi Kasei Corp.) having a thickness of 25 μm was laminated on the resulting laminate. After the second electrically insulating layer 35 and the electrically insulating layer 35 were irradiated with ultraviolet light while predetermined positions were covered with glass masks capable of shielding the light, the second electrically insulating layer 35 and the electrically insulating layer 35' were developed in an alkaline solution. Then, the board material 3 was immersed in an electrolytic plating solution of copper sulfate and plated at the rate of 2.5 A/dm² for about 36 minutes to thereby form a first electric conductor wiring 36 made of a copper plating with a thickness of 18 μm. Then, as each of films 37, and 37', a photosensitive electrically insulating film (e.g., RY3206 made by Hitachi Chemical Co. Ltd.) having a thickness of 6 μm was laminated on the resulting laminate. After the film 37' was exposed and developed in accordance with a desired wiring pattern, the 18 μm-thick first electric conductor layer 31 was dissolved in ferric chloride to thereby form a second electric conductor wiring 38. Further, the films 37 and 37', the second electrically insulating layer 35, the electrically insulating layer 35' and the electrically conductive thin-film layer 34 were removed. Thus, a double-sided circuit board 30 was obtained. It was confirmed that the first electric conductor wiring 36 was formed uniformly and the difference between the wiring width in the surface and the wiring width in the bottom was reduced extremely in the double-sided circuit board 30 manufactured according to this example. In addition, the double-sided circuit board 30 was produced as a board having high dimensional stability, hardly curled and having sufficient flexing characteristic.

Example 4

In this example, a double-sided circuit board was manufactured by the manufacturing method according to the fourth embodiment shown in FIGS. 4A to 4I. First, as a board material 4, there was used a copper-clad laminate (e.g., ESPANEX made by Nippon Steel Chemical Co., Ltd. or NEOFLEX made by Mitsui Chemicals Inc.) in which a first electrically insulating layer 41 made of a polyimide resin with a thickness of 12 μm was formed directly on one surface of a first electric conductor layer 41 made of copper foil with a thickness of 18 μm. Then, conduction holes 43 each having a diameter of 80 μm were formed by chemicals. Then, an electrically conductive thin-film layer 44 made of an Ni/Cr alloy with a thickness of 400 Å was formed by sputtering. Further, an electrically conductive thin-film layer made of Cu was formed on the electrically conductive thin-film layer 44 by sputtering. Then, as each of a second electrically insulating layer 45 and an electrically insulating layer 45', a photosensitive electrically insulating film (e.g., SPG252 made by Asahi Kasei Corp.) having a thickness of 25 μm was laminated on the resulting laminate. After the second electrically insulating layer 45 and the electrically insulating layer 45' were irradiated with ultraviolet light while predetermined positions were covered with glass masks capable of shielding the light, the second electrically insulating layer 45 and the electrically insulating layer 45' were developed in an alkaline solution. Then, the board material 4 was immersed in an electrolytic plating solution of copper sulfate and plated at the rate of 2.5 A/dm² for about 18 minutes to thereby form a first electric conductor wiring 46 made of a copper plating with a thickness of 8 μm. Then, as each of films 47 and 47', photosensitive electrically insulating film (for example, RY3206 made by Hitachi Chemical Co., Ltd.) having a thickness of 6 μm was laminated on the resulting laminate. After the film 47' was exposed and developed in accordance with a desired wiring pattern, the 18 μm-thick first electric conductor layer 41 was dissolved in ferric chloride to thereby form a second electric conductor wiring 48. Further, the films 47 and 47', the second electrically insulating layer 45, the electrically insulating layer 45' and the electrically conductive thin-film layer 44 were removed. Thus, a double-sided circuit board 40 was obtained. It was confirmed that the first electric conductor wiring 46 was formed uniformly and the difference between the wiring width in the surface and the wiring width in the bottom was reduced extremely in the double-sided circuit board 40 manufactured according to this example. In addition, the double-sided circuit board 40 was produced as a board having high dimensional stability, hardly curled and having sufficient flexing characteristic.

Example 5

In this example, a double-sided circuit board was manufactured by the manufacturing method according to the fifth embodiment shown in FIGS. 5A to 5I. First, as a board material 5, there was used a copper-clad laminate in which a first electrically insulating layer 52 made of a photosensitive polyimide resin with a thickness of 12 μm was formed directly on one surface of a first electric conductor layer 51 made of copper foil with a thickness of 18 μm. Then, conduction holes 53 each having a diameter of 80 μm were formed by chemicals. Then, an electrically conductive thin-film layer 54 made of An Ni/Cr alloy with a thickness of 400 Å was formed by sputtering. Then, as each of a second electrically insulating layer 55 and an electrically insulating layer 55', a photosensitive electrically insulating film (e.g., SPG252 made by Asahi Kasei Corp.) having a thickness of 25 μm was laminated on the resulting laminate. After the second electrically insulating layer 55 and the electrically insulating layer 55' were irradiated with ultraviolet light while predetermined positions were covered with glass masks capable of shielding the light, the second electrically insulating layer 55 and the electrically insulating layer 55' were developed in an alkaline solution. Then, the board material 5 was immersed in an electrolytic plating solution of copper sulfate and plated at the rate of 2.5 A/dm² for about 36 minutes to thereby form a first electric conductor wiring 56 made of a copper plating with a thickness of 18 μm. Then, as each of films 57 and 57', a photosensitive electrically insulating film (e.g., RY3206 made by Hitachi Chemical Co., Ltd.) having a thickness of 6 μm was laminated on the resulting laminate. After the film 57 and 57' were exposed and developed in accordance with a desired wiring pattern, the 18 μm-thick first electric conductor layer 51 was dissolved in ferric chloride to thereby form a second electric conductor wiring 58. Also a predetermined portion of the first electric conductor wiring 36 was dissolved so that a predetermined wiring patter of the first electric conductor wiring 36 was formed. Further, the films 57 and 57', the second electrically insulating layer 55, the electrically insulating layer 55' and the electrically conductive thin-film layer 54 were removed. Thus, a double-sided circuit board 50 was obtained. It was confirmed that the first electric conductor wiring 56 was formed uniformly and the difference between the wiring width in the surface and the wiring width in the bottom was reduced extremely in the double-sided circuit board 50 manufactured according to this example. In addition, the double-sided circuit board 50 was produced as a board having high dimensional stability, hardly curled and having sufficient flexing characteristic.

In the method for manufacturing a double-sided circuit board according to the invention as described above, since a first electric conductor wiring is formed by electroplating, a semiconductor device or the like can be mounted on the first electric conductor wiring side to meet the requirement of high density fine wiring. That is, the first electric conductor wiring can be formed uniformly without being influenced by the wiring width or the gap width, and the difference, between the wiring width in the surface and the wiring width in the bottom can be reduced extremely. In addition, even in the case where the manufacturing method according to the invention is used for manufacturing a flexible circuit board, the influence of carrying tension in a continuous carrying (sheeting) process can be reduced greatly because the first electric conductor layer has been already formed on the first electrically insulating layer in the step of forming the first electric conductor wiring by electroplating. As a result, a double-sided circuit board having high dimensional stability and hardly curled can be obtained.

Further, a second electrically insulating layer is formed on portions requiring flexing characteristic such as bending characteristic so that so that the first electric conductor wiring can be prevented from being formed on the portions by plating (in addition, portions of the other surface of the first electric conductor layer where the first electric conductor wiring is not formed are dissolved chemically as occasion demands). Accordingly, sufficient flexing characteristic can be obtained.

What is claimed is:

1. A method of manufacturing a double-sided circuit board from a board material constituted by a first electric conductor layer and a first electrically insulating layer formed on one surface of the first electric conductor layer, comprising:

a first step of making conduction holes in said board material so that said conduction holes penetrate only said first electrically insulating layer or both said first electrically insulating layer and said first electric conductor layer from predetermined portions of said first electrically insulating layer;

a second step of forming an electrically conductive thin-film layer both on a surface of said first electrically insulating layer and on wall surfaces of said conduction holes;

a third step of forming a second electrically insulating layer on at least one predetermined portion of said electrically conductive thin-film layer;

a fourth step of forming a first electric conductor wiring by plating on a portion of said electrically conductive thin-film layer where said second electrically insulating layer is not formed;

a fifth step of covering said first electric conductor wiring with a chemical-resistant film;

a sixth step of forming a second electric conductor wiring by chemically dissolving at least one predetermined portion of another surface of said first electric conductor layer in chemicals; and a seventh step of removing said second electrically insulating layer and said chemical-resistant film.

2. A method of manufacturing a double-sided circuit board according to claim 1, wherein second electrically insulating layers are formed on at least one predetermined portion of said electrically conductive thin-film layer and on at least one predetermined portion of said another surface of the first electric conductor layer in the third step.

3. A method of manufacturing a double-sided circuit board according to claim 2, wherein the second electrically insulating layers are formed on the whole of said another surface of the first electric conductor layer in the third step.

4. A method of manufacturing a double-sided circuit board according to claim 1, wherein said conduction holes penetrate only said first electrically insulating layer.

5. A method of manufacturing a double-sided circuit board according to claim 1, wherein a predetermined portion of said first conductor wiring is chemically dissolved in chemicals so that a predetermined pattern of said first conductor wiring is formed in said sixth step.

* * * * *